(12) United States Patent
McAllister et al.

(10) Patent No.: US 6,342,788 B1
(45) Date of Patent: Jan. 29, 2002

(54) PROBING SYSTEMS FOR CHILLED ENVIRONMENT

(75) Inventors: Michael Ford McAllister, Clintondale, NY (US); Gerhard Ruehle, Sommerhofenstrasse (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/324,497

(22) Filed: Jun. 2, 1999

(51) Int. Cl.⁷ .......................... G01R 31/02; G01R 31/26
(52) U.S. Cl. ...................... 324/754; 324/758; 324/757; 324/761; 324/765
(58) Field of Search ............................... 324/754, 760, 324/758, 765, 761, 158.1, 755; 165/80.2; 439/482

(56) References Cited

U.S. PATENT DOCUMENTS

| | | | |
|---|---|---|---|
| 4,607,220 A | * | 8/1986 | Hollman .................. 324/760 |
| 4,845,426 A | * | 7/1989 | Nolan et al. .............. 324/760 |
| 5,283,518 A | * | 2/1994 | King et al. ............... 324/761 |
| 5,325,052 A | * | 6/1994 | Yamashita ................ 324/760 |
| 6,084,419 A | * | 7/2000 | Sato et al. ................ 324/754 |

* cited by examiner

*Primary Examiner*—Safet Metjahic
*Assistant Examiner*—Anjan Deb
(74) *Attorney, Agent, or Firm*—Lynn L. Augspurger; Cantor Colburn LLP

(57) ABSTRACT

A probe test assembly for testing electronic devices maintained at lowered temperatures includes heaters and flows of dried air to prevent condensation from forming on the devices. The devices have pins received in an electrically non-conductive system board, and the probe test assembly includes a heat conductive and electrically conductive apertured probe plate to transfer heat from the heaters to the system board. Grounding pins extend from the probe plate to grounding pads on the system board, and a non-conductive apertured pattern plate spaced above the probe plate protects exposed ends of the grounding pins. In an alternate embodiment, the pattern plate is omitted in favor of a conductive intermediate plate and a superposed non-conductive contact plate. Signal pins extend from the system board to the contact plate in order to transfer contact points for electronic device from the system board to the contact plate. A multipin connector can be connected to the contact plate to enable the transmission of signals from the devices under test to a computer.

19 Claims, 4 Drawing Sheets

PROBING SYSTEMS FOR CHILLED ENVIRONMENT

FIELD OF THE INVENTION

The present invention relates to a method and apparatus for making high frequency measurements of super cooled system boards for the purposes of testing and/or implementation of engineering changes. More specifically, the present invention relates to a probing system for super cooled system boards by which moisture condensation and corrosion formation on the test site are avoided.

In the testing of large systems during the initial bring up and including debugging of system hardware, special modifications are typically made to the product. A metal stiffener used to support the large system boards is machined so that an open access is provided to e.g., pins of a Device Under Test (DUT), such as a Multi Chip Module (MCM), as well as to other points of interest. A method of measuring system operations utilizing holes drilled through a probe template made of an insulating material offers a full range of interconnections at all signal locations and selected ground or voltage reference locations of the DUT.

With the ever increasing operational speeds of computer systems, including mainframes, it is becoming more and more difficult to provide accurate measurements of operational parameters such as switching noise and signal integrity, jitter measurements, measurements of differential signals, and differential measurements of voltage to ground disturbances. To achieve higher operational speeds, future systems require that the temperature of the electronics' operational point be reduced to near zero degrees C and below. Any testing with one side of a system at extremely low temperatures and the other side in an exposed room environment will cause condensation to form. This condensation will, over a period of time, cause corrosion of exposed metal interface connections. This is permissible in a dedicated system that will be scrapped, but not for machines that are to be used over long periods of time.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

SUMMARY OF THE INVENTION

A probe test assembly according to the present invention which prevents condensation from forming on a Device Under Test (DUT) cooled to a temperature approaching 0âC. or even less than 0âC. includes a heat conducting probe plate mounted on one side of a large system board on the opposite side of which the DUT is mounted, with pins of the DUT extending into openings in the probe plate. Electrical resistance heaters are secured in heat-conducting relationship on the probe plate, which conducts the heat to the large system board and to the DUT, thereby raising the temperature of the pin side of the board above a level at which condensation forms. A large recess formed in the underside of the probe plate defines with the large system board a chamber which is pressurized by desiccated air is fed under pressure through passages in heat transfer relationship with the probe plate. Desiccated air under pressure is also fed directly to a space between the large system board and the DUT. Ground pins extend from openings in the probe plate to grounding pad locations at openings in the large system board. A non-conductive pattern plate having openings in alignment with the openings in the probe plate is space above the probe plate, and electric test probes are inserted through the aligned openings in the pattern plate and the probe plate to the openings in the large system board receiving the pins of the DUT. In view of the foregoing, the probe test assembly of the present invention provides for testing of DUT's which is non-permanent, non-destructive and free from condensation.

In an alternate embodiment, the pattern plate is omitted in favor of a conductive intermediate plate space above the probe plate and a non-conductive contact plate spaced above the intermediate plate. Both the intermediate plate and the contact plate have openings aligned with the openings in the probe plate. Ground pin connections between the contact plate and grounding pad locations at openings in the large system board are made either by ground pins each extending all of the way from the contact board to the large system board or by a first set of grounding pins extending from the contact plate to the intermediate plate and a second set of grounding pins extending from the probe plate to the large system board. Signal pins extend from openings in the large system board, through openings in the probe plate and the intermediate plate, all the way to the contact plate, thereby transferring contact points for the DUT from a confined area of the large system board to the contact plate, which is unconfined. A multipin connector connected to the signal pin receiving openings of the contact plate can be mounted on the contact plate, so that the probe test assembly can be connected to a computer.

DESCRIPTION OF THE DRAWINGS

The foregoing and other objects, aspects and advantages will be better understood from the following detailed description of a preferred embodiment of the invention with reference to the drawings, wherein.

DETAILED DESCRIPTION OF THE INVENTION

Figure 1:
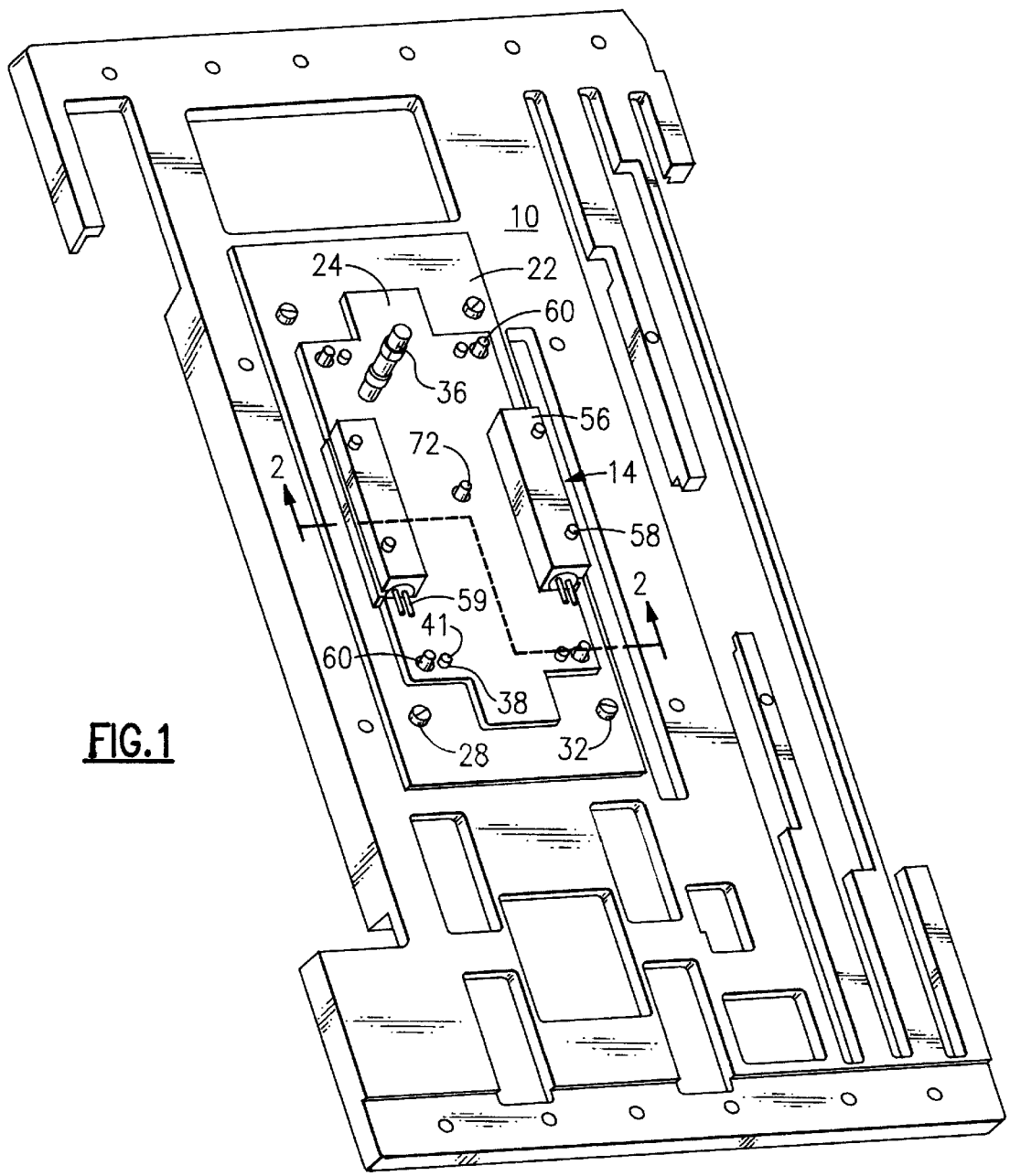
FIG. 1 is a perspective view of a stiffener with a probe test assembly in accordance with the present invention.
Figure 2:
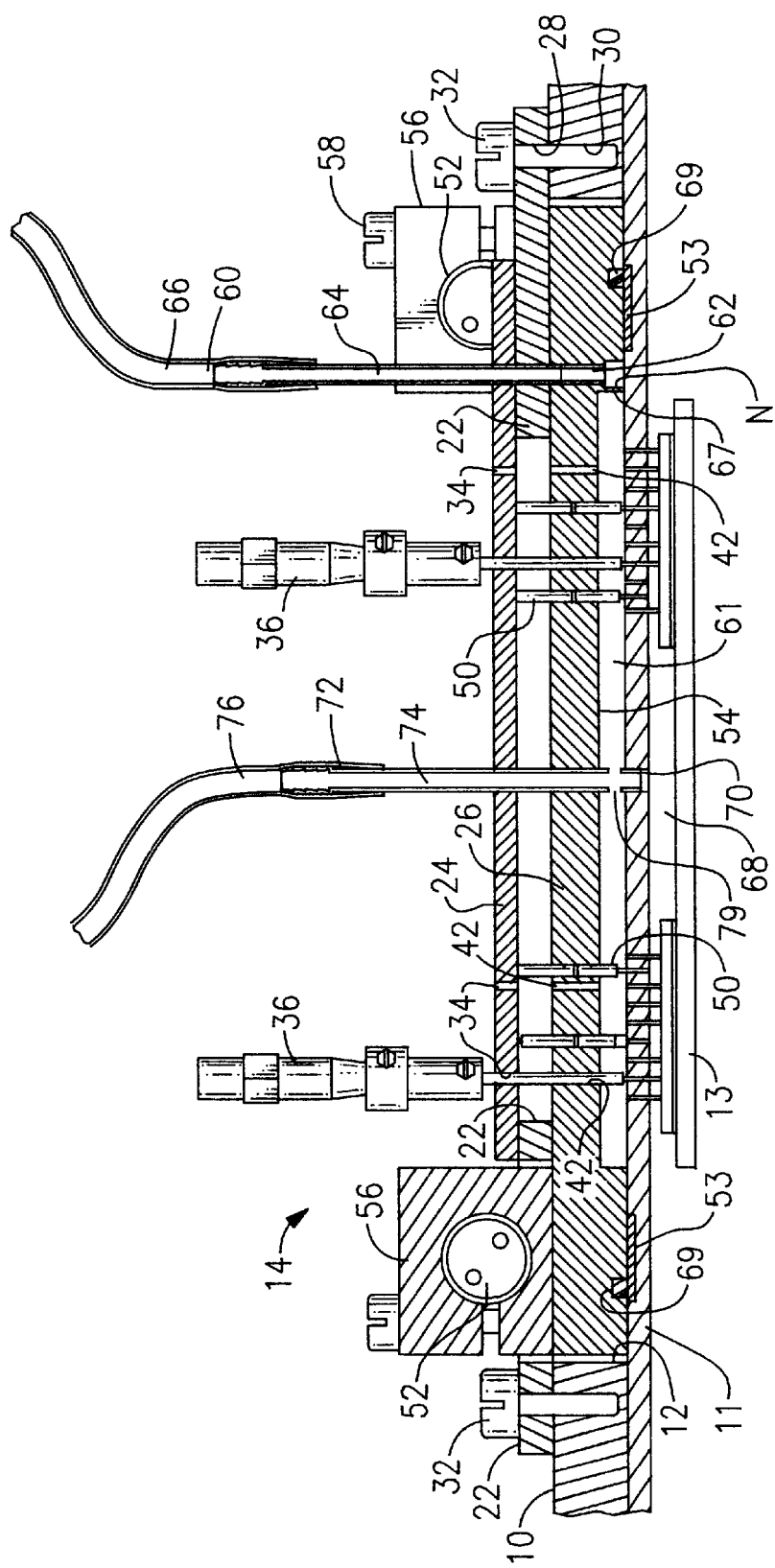
FIG. 2 is an enlarged cross section of the probe test assembly in accordance with the present invention taken along the line 2—2 in FIG. 1 and positioned above a device under test.

Referring to FIGS. 1 and 2, a metal stiffener 10 used to support a large system board 11 has an opening 12, sometimes called a "manhole", defined (e.g., machined) therein. The use of a metal stiffener (or other supporting structure) to support a large system board is well known. The opening 12 in the stiffener 10 is located to provide access to an area of interest on the large system board 11, such as the pin side of a Device Under Test (DUT) 13, e.g., a Multi Chip Module (MCM), whose pins are received in openings in the large system board. It will be appreciated that the scope of the present invention encompasses providing access for testing (or other purposes) of any component that is normally covered by a stiffener and is not limited to an MCM. A probe test assembly 14 is positioned at the opening 12 when testing (e.g., a system test, such as when error injection and recovery, is required to understand and circumvent system failure mechanisms) is desired, thereby providing access to the pins of the DUT 13, as is described hereinafter. The probe test assembly 14 is preferably shaped similar to the opening 12 in the stiffener 10, although any shape may be employed. In the present example, the probe test assembly 14 is generally rectangular (as is the opening 12).

The probe test assembly 14 comprises a frame 22, a pattern board or plate 24, and a probe plate 26, wherein the frame supports the pattern plate spaced above the probe plate. The frame 22 has opposing surfaces, with one of the surfaces facing and bearing on the stiffener 10. A plurality of alignment pins (not shown) are received in alignment holes in the frame 22, extending above and in corresponding alignment holes in the stiffener 10 to correctly position the frame 22, and therefore the probe test assembly 14, relative to the pins of the DUT 13. The frame 22 has four mounting holes 28 therethrough (FIG. 2) which align with corresponding mounting holes 30 in the stiffener 10. The probe test assembly 14 is secured onto the stiffener 10 by screws 32 in the mounting holes 28 and 30 or by other suitable fastening arrangement. The frame 22 is preferably comprised of an electrical insulation material, such as FR4, thereby insulating the probe plate 26 from the stiffener 10. The probe test assembly 14 of this exemplary embodiment is particularly well suited for high frequency measurement applications, as described more fully hereinafter. Further, the probe test assembly 14 provides for nondestructive probing of the pins of the DUT 13.

The pattern plate 24 has a lower surface facing the probe plate 26. A pattern or array of holes 34 corresponding to the patter of pins on the DUT 13 is provided through the pattern plate 24 to provide an insulated guide path for a probe 36. The pattern plate 24 has a plurality of mounting holes 38 therethrough which align with a plurality of mounting holes (not shown) in the probe plate 26. The pattern plate 24 is secured onto the probe plate 26 by screws 41 through the mounting holes 38 and the mounting holes in the probe plate or by other suitable fastening means. The pattern plate 24 is preferably made of an electrical insulation material, such as FR4. Preferably, nomenclature (not shown) indicative of the I/O pins of the DUT 13 and their positions relative to the holes 34 of the pattern plate 24 is provided on the outer surface of the pattern plate.

The probe plate 26 has a surface facing the large system board 11. A pattern or array of holes 42 corresponding to the input/output locations on the large system board 11 is machined through the probe plate 26, which is made of a nonferrous metal, such as gold-plated brass. For clarity of illustration, only a few of the holes 42 have been shown, but it is understood that holes 42 are present all across the probe plate 26 and that there are actually thousands of such holes. The pattern of holes 34 in the pattern plate 24 may comprise a full compliment of the I/O locations in the probe plate 26, thus providing access to all locations. Alternatively, the pattern of holes 34 in the pattern plate 24 may comprise a limited number of holes suitable for testing applications that require multiple testing of a limited number of signal locations. Such limited testing access limits the incidence of probing errors and the possibilities of causing a DUT to cease functioning, especially in an environment where the DUT is mission critical and can not be stopped. A plurality of alignment pins (not shown) are received in alignment holes in the probe plate 26 and in corresponding alignment holes in the frame 22 to position the pattern plate 24 and the probe plates 26 on the frame 22 and, ultimately, to position the pattern and the probe plates relative to the pins of the DUT 13. The probe plate 26 has four mounting holes therethrough which align with a plurality of mounting holes in the frame 22. The probe plate 26 is secured onto the frame 22 by screws (or other suitable fastening means) through these mounting holes.

In high frequency applications, the probe plate 26 is metal and is part of the measurement system. Resilient ground pins, or terminals, 50 are pressed into selected holes 42 in the metal probe plate 26 to provide a low impedance ground return path for test measurements. The ground pins 50 provide a permanent return path that is uniform and consistent every time the probe test assembly 14 is used. An exemplary ground path is from the probe 36, through the metal probe plate 26 to a ground pin 50, and through the ground pin 50 to a ground pad on the system board 11 which is contacted by the ground pin. The probe 36 is a high frequency probe which is used to access signal points (i.e., pins of the DUT 13) through the appropriate holes 34 in the pattern plate 24 and the corresponding holes 42 in the probe plate 26, with the signal return path being provided by the close proximity of the ground pins 50. The pattern plate 24 provides a non-conductive mechanical cover for the exposed ends of the grounding pins 50 in the metal probe plate 26. As described hereinbefore, probe plate 26 is insulated from the stiffener 10 by the insulating material of the frame 22 to enhance measurement integrity, thereby insuring that the noise generated by other package components are not coupled in the measurements.

The DUT 13 is maintained at a temperature lower than ambient temperature, typically at a temperature nearly as low as 0âC. or even below 0âC. In contrast, the ambient temperature, that is, the temperature on the side of the large system board 11 opposite the side on which the DUT 13 is positioned, is typically room temperature. As a result, condensation tends to form on the side of DUT 13 facing the large system board 11, including the pins of the DUT. In addition, the ends of the DUT pins are exposed to the relatively warm, moist ambient air, and the same air moves through unoccupied openings in the large system board 11 and into contact with other portions of the DUT 13.

Electrical resistance heater coils 52 are mounted on the ambient in side of the probe plate 26 to heat the probe plate, particularly by conduction. In turn, the heated probe plate 26, which covers the area of the large system board 11 in which the testing is being done and contacts a portion of the large system board surrounding that area, transfers heat to the DUT pins and the large system board 11, and through the DUT pins and the large system board to other portions of the DUT 13. A thermal pad 53, for example, in the form of a thin copper strip, can be interposed between the perimeter of the probe plate 26 and to the large system board 11 to enhance heat conduction. The thickness of the thermal pad 53 has been exaggerated in FIGS. 2 and 3 for clarity of illustration. The thermal pad 53 can be an integral part of the large system board. A recess 54 is defined in the underside of the probe plate 26, the recess extending over the entire area of the large system board 11 in which testing is being done. The heat of the probe plate 26 heats the air in the recess 54. The electrical heater coils 52 are contained in housings 56 which are secured by, for example, screws 58 to the outer surface of the probe plate 26, outside but adjacent to the area containing openings for the probes 36. The housings 56 can be secured alternatively by welding or physical compression in a channel, or can be formed from one piece with the probe plate 26, such as by casting. Leads 59 extend from the electrical heater coils 56 to a source of electrical power, and conventional equipment can be used to control the heat generated by the electrical heater coils. In this regard, a feedback system for temperature control can be provided by one or more thermocouples (not shown) imbedded in or attached to the probe plate 26.

In addition, a plurality of dry air supply conduits 60 provide dry air under pressure to the recess 54 on the underside of the probe plate 26. Since the probe plate 26 contacts the large system board 11 all along a line surrounding the recess 54, the recess and the upper surface of the large system board define a chamber 61 pressurized with dry air under pressure from a source of dry air (not shown). The source of dry air removes moisture from air in a conventional way, such as by using desiccant crystals. As can be appreciated from FIG. 1, the conduits 60 are located in spaced positions on the pattern plate 24, such as one of the conduits being located near each of the corners of the pattern plate. As can be seen from FIG. 2, each conduit 60 extends through the pattern plate 24 and the probe plate 26 into communication with the chamber 61. A specific structure for a conduit 60 can be a passage 62 in the probe plate 26, one end of a relatively rigid tube 64 received in one end of the passage and held there by, for example, a frictional fit, and an end of a flexible tube 66 connected to the relatively rigid tube 64, the opposite end of the flexible tube being connected to the source of dry air. A flange 67 extends downward from the probe plate 26 between the passage 62 and the recess 54 to define with the large system board 11 a nozzle N. Dry air issues from the nozzle N and sweeps across the large system board 11 toward the center of the probe plate 26, removing any moisture from around the ground pins 50, the ends of the probes 36, and exposed ends of pins of the DUT.

The dry air pressurizes the chamber 61 defined by the recess 54 and the large system board. As a result, dry air flows from the chamber 61 out through the openings 42 in the probe plate 26, thereby preventing relatively moist air from entering the chamber. The dry air also flows from the chamber 61 through the openings in the large system board 11 and into a space 68 between the cold side of the large system board and the DUT 13, thereby keeping dry the space 68 and the pin side of the DUT 13. Furthermore, the movement of the dry air through the passage 62 in the probe plate 26 and into the recess 54 on the underside of the probe plate heats the dry air, thereby giving the air greater drying ability when it reaches the pins and other portions of the DUT. The thermal pad 53 coacts with a thermoelastic seal 69 on the underside of the probe plate 26 to help prevent the loss of dry, heated air from the chamber 61 through the sides of the chamber and the ingress of moist air into the chamber through the sides.

A test head alignment aperture 70 is defined in the large system board 11 to receive a test head alignment pin 72 associated with the test probe assembly to precisely align the openings 42 in the probe plate 26 and the openings 34 in the pattern plate 24 with the DUT pin receiving openings in the large system board 11. Typically, the test head alignment pin 72 passes through alignment openings in the pattern plate 24 and the probe plate 26. In the probe test assembly 14 of the present invention, the test head alignment pin 72 is a relatively rigid tube 74 connected by a flexible tube 76 to a source of dry air. As a result, dry air passes directly from the source, through the test head alignment aperture 70 in the large system board 11, to the space 68 between the large system board and the DUT 13. Since the relatively rigid tube 74 passes through the heated probe plate 26, and the recess 54, the dry air flowing through the tube is heated so as to provide additional drying ability. As an option, lateral apertures 79 can be provided in the tube 74 within the recess 54 to supply additional dry air to the chamber 61.

Figure 3:
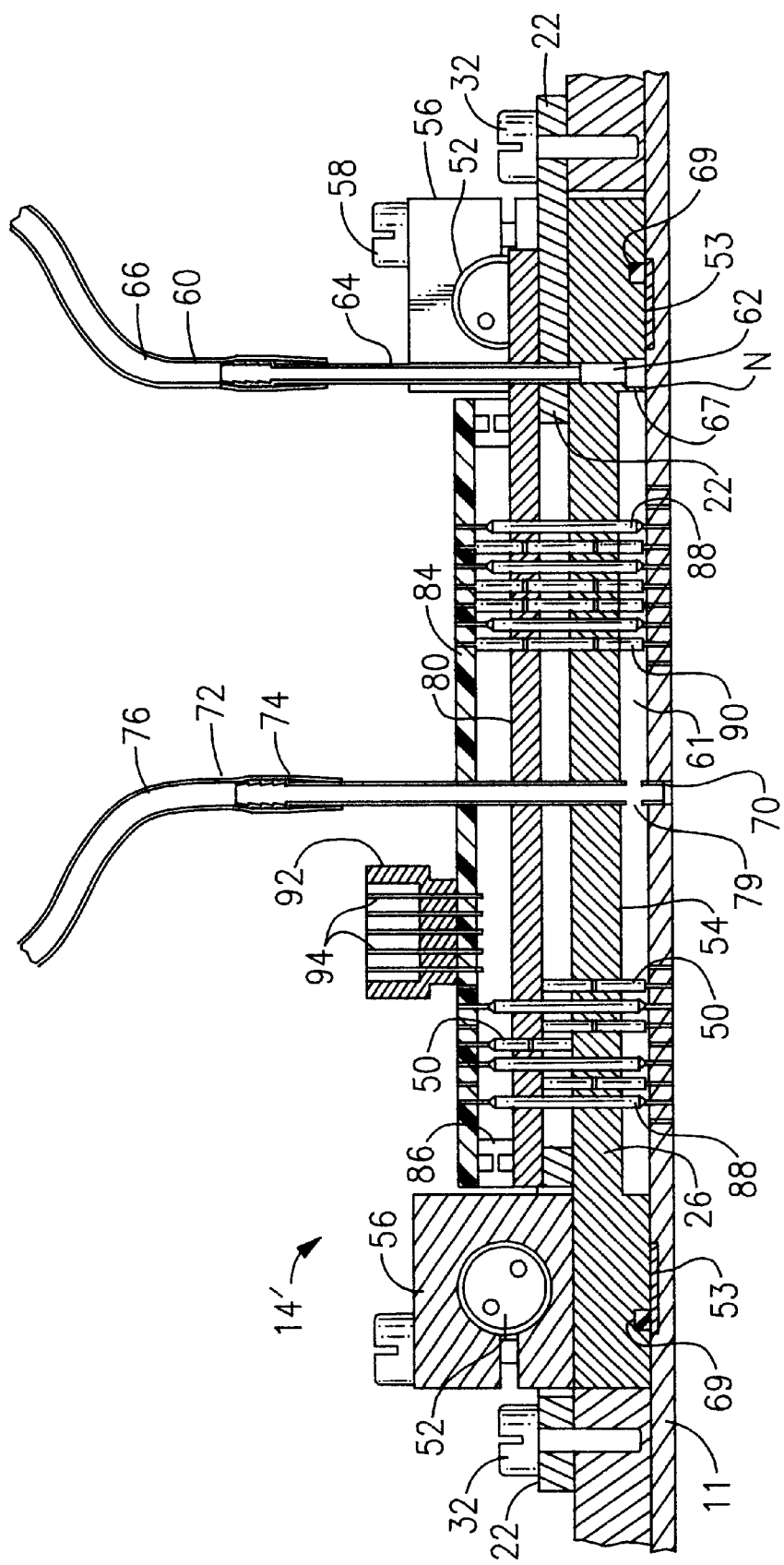
FIG. 3 is an enlarged cross section of an alternate embodiment of the probe test assembly in accordance with the present invention.
Figure 4:
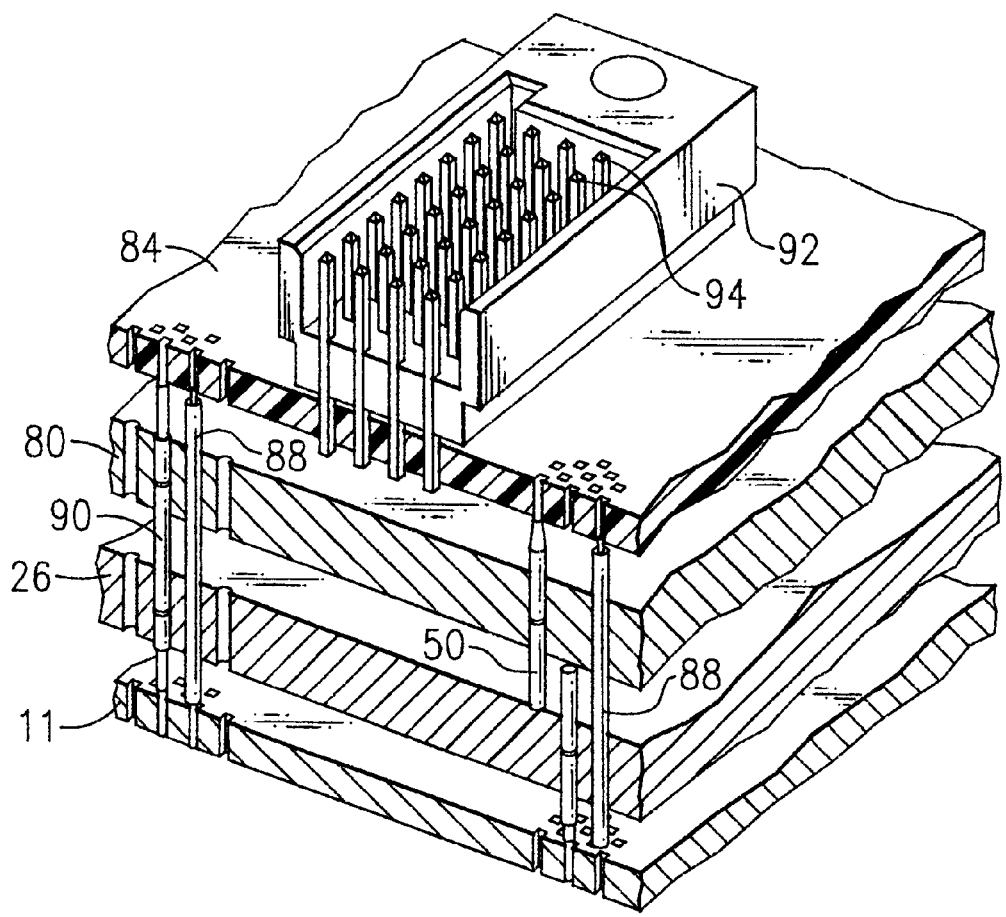
FIG. 4 is a further enlarged perspective view of a portion of the embodiment of FIG. 3, showing a different arrangement of signal pins and ground pins and an additional forward portion of the pattern board.

As can be seen from FIGS. 3 and 4, in an alternate embodiment of the present invention, provisions are in a probe test assembly 14' made to permit probes to contact points spaced above the large system board. Other than as specifically described and/or illustrated in connection with this embodiment, the embodiment has the same features as the previously described embodiment. Instead of the pattern plate 24, an electrically conductive apertured intermediate plate 80 is positioned just above the probe plate 26. The intermediate plate 80 is spaced above the openings 42 in the probe plate 26 to accommodate and protect portions of the ground pins 50 which project above the probe plate. The spacing is provided by a depending spacer frame 22, like that of FIG. 2. An apertured non-conductive contact board 84 is supported at its perimeter on the intermediate plate 80, with a large central portion of the contact board spaced above apertures 86 in the intermediate plate 80. This spacing can be provided by a seal frame 86 extending along the underside of the perimeter of the contact board 84. The contact board 84 is secured to the intermediate plate 80 by screws or the like (not shown) extending through the seal frame 86. The positions of the apertures in the contact board 84 correspond to the positions of the pins of the DUT 13 for both measuring and grounding purposes.

Other apertures can be provided in the contact board 84 for grounding purposes. The test head alignment pin 72 also passes through precisely positioned alignment openings provided in the intermediate plate 80 and the contact board 84. Probe pins or signal pins 88 extend from pins of the DUT 13 exposed in the openings of the large system board 11, through aligned openings 42 in the probe plate 26 and the intermediate plate 80 to apertures in the contact board 84. As a result, contact points for the DUT are transferred up from the large system board 11, in an area confined by portions of the probe test assembly 14', to an unconfined area on an opposite side of the probe test assembly and on an opposite side of the heating arrangement from the large system board. The unconfined area is especially significant because large numbers of DUT inputs and outputs are often used f simultaneously, and the confined area within the probe test assembly 14' is typically 6 inches by 6 inches. As can be seen from the left side of FIG. 3, grounding can be provided by a first level of grounding pins 50 extending from grounding pads on the large system board 11 to the probe plate 26 and a second level of grounding pins 50 extending from the intermediate plate 80 to grounding pads at apertures in the contact board 84. As an alternative to the two levels of grounding pins 50, double sided grounding pins 90 can be used which extend from the large system board 11, through openings in the probe plate 26 and the intermediate plate 80, to the contact board 84.

A multi-pin interface connector 92 or other surface mount connection apparatus is provided on the contact board 84 so that a computer can be connected quickly and easily to the probe test assembly to record and analyze measurements obtained therefrom, especially when a large number of signals are transmitted at one time and/or when repeated measurements are to be made. Conductive paths are provided on the contact board 84 from apertures receiving the signal pins 88 to apertures receiving pins 94 of the multi-pin interface connector 92. The grounding pins 50 or the double-sided grounding pins 90 in the arrangements described above provide return current paths for the multi-pin interface connector 92 to the large system board 11.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A probe test assembly for probing a device under test maintained at a temperature below ambient temperature, comprising:
    a pattern board having a plurality of guide holes therethrough, said pattern board comprised of an insulating material on an outside surface of said pattern board and extending over the device in a region of the device to be probed;
    an electrically and thermally conductive probe plate associated with said pattern board and extending over the device in the region of the device to be probed, and having a plurality of probe holes therethrough which are aligned with said guide holes in said pattern board;
    a ground pin electrically connected to and extending from said probe plate, wherein during use of said probe test assembly said probe holes are positioned relative to the device under test for probing a signal thereon, and said ground pin is located for electrical connection of said ground pin to a ground of the device under test; and
    means for preventing condensation from forming on the device under test.

2. The probe test assembly of claim 1, wherein the device under test has a side facing the probe test assembly and said means for preventing condensation comprises means for heating the side of the device under test facing the probe test assembly.

3. The probe test assembly of claim 2, wherein the device under test is spaced from the probe test assembly, and air is in the space, and said means for heating comprises means for heating the side of the device under test facing the probe test assembly to a temperature above the temperature at which moisture in the air condenses.

4. The probe test assembly of claim 3, wherein the device under test is spaced from the probe test assembly, air is in the space, and said means for preventing condensation further comprises means for supplying to the space between the device under test and the pattern plate a flow of air drier than the ambient air.

5. The probe test assembly of claim 4, wherein a system board is positioned between the probe test assembly and the device under test, and said means for supplying a flow of drier air comprises an opening through the system board and a hollow pin extending into said opening, said hollow pin being in fluid communication with a source of drier air under pressure.

6. The probe test assembly of claim 5, wherein said probe plate has an opening, and said hollow pin extends through the opening in the probe plate.

7. The probe test assembly of claim 6, further comprising means for aligning the probe holes in the probe plate with guide holes in the pattern board, the means for aligning comprising the opening through the pattern board, the probe plate opening and said hollow pin.

8. The probe test assembly of claim 5, wherein said probe plate is made of metal, said probe plate contacts said system board, and said means for heating the side of the device under test facing the probe test assembly comprises means for heating the probe plate.

9. The probe test assembly of claim 8, wherein said means for heating the probe plate comprises at least one heating coil mounted on said probe plate.

10. The probe test assembly of claim 5, wherein said probe plate has a side facing the system board, said side defining a recess extending across most of the area of said side, said side further has a structure surrounding said recess and being in sealing contact with said system board along all of a line surrounding said recess to define a chamber between a portion of said probe plate and said system board, and said means for preventing condensation comprises said recess, said surrounding structure, and means for maintaining in said chamber air drier than ambient air at a pressure greater than ambient pressure.

11. The probe test assembly of claim 10, wherein said means for maintaining comprises at least one conduit in fluid communication with said chamber.

12. The probe test assembly of claim 11, wherein said probe plate defines at least one port receiving said conduit and a passage extending from said port to said chamber.

13. The probe test assembly of claim 12, wherein a nozzle is positioned in said passage at said chamber, said nozzle issuing a flow of air sweeping along the system board.

14. The probe test assembly of claim 1, further comprising an electrically non-conductive cover plate covering and spaced above said probe plate, said cover plate having a plurality of probe apertures in alignment with the probe holes of the probe plate.

15. The probe test assembly of claim 1, further comprising means for mounting said probe plate in contact with said pattern board.

16. A probe test assembly for probing a device under test mounted on a system board and maintained at a temperature below ambient temperature, comprising:
    an electrically and thermally conductive probe plate adapted to be positioned on said system board and having a plurality of holes therethrough which are aligned with holes in said system board associated with input/output locations on said system board;
    an intermediate plate positioned on said probe plate, said intermediate plate having a plurality of openings in alignment with the openings in the probe plate;
    a contact plate positioned above said intermediate plate, said contact plate having a number of openings in alignment with said openings in said intermediate plate;
    at least one ground pin connection extending from the system board and through and in electrical contact with said probe plate, and through said intermediate plate to said contact plate;
    at least one signal pin extending from the system board and through said probe plate and said intermediate plate to said contact plate, whereby electrical contact points for the device under test are transferred from the system board to said contact plate; and
    means for preventing condensation from forming on the device under test.

17. The probe test assembly of claim 16, further comprising a multipin connector mounted on said contact plate, wherein the probe test assembly comprises a plurality of signal pins, and said multipin connector is electrically connected to said signal pins.

18. A probe test assembly for probing a device under test mounted on a system board, comprising:

an electrically and thermally conductive probe plate adapted to be positioned on said system board and having a plurality of holes therethrough which are aligned with holes in said system board associated with input/output locations on said system board;

an intermediate plate positioned on said probe plate, said intermediate plate having a plurality of openings in alignment with the openings in the probe plate;

a contact plate positioned above said intermediate plate, said contact plate having a number of openings in alignment with said openings in said intermediate plate;

at least one ground pin connection extending from the system board and through and in electrical contact with said probe plate, and through said intermediate plate to said contact plate; and at least one signal pin extending from the system board and through said probe plate and said intermediate plate to said contact plate, whereby electrical contact points for the device under test are transferred from the system board to said contact plate.

19. The probe test assembly of claim 18, further comprising a multipin connector mounted on said contact plate, wherein the probe test assembly comprises a plurality of signal pins, and said multipin connector is electrically connected to said signal pins.

* * * * *